United States Patent [19]

Larsen et al.

[11] Patent Number: 4,723,189

[45] Date of Patent: Feb. 2, 1988

[54] NEGATIVE SEQUENCE DETECTOR FOR A CONTINUOUS WAVE FREQUENCY TRANSDUCER

[75] Inventors: Einar V. Larsen, Ballston Lake, N.Y.; Russel G. Shiflett, Salem, Va.

[73] Assignee: General Electric Company, New York, N.Y.

[21] Appl. No.: 945,482

[22] Filed: Dec. 23, 1986

[51] Int. Cl.$^4$ ............................................. H02H 3/26
[52] U.S. Cl. ..................................... 361/76; 307/127; 324/86; 324/108
[58] Field of Search .................... 361/76, 77; 307/127; 324/86, 108

[56] References Cited

U.S. PATENT DOCUMENTS

| | | | |
|---|---|---|---|
| 4,146,913 | 3/1979 | Sun | 324/108 X |
| 4,210,948 | 7/1980 | Waltz | 361/76 |
| 4,342,062 | 7/1982 | Hodges | 361/76 |
| 4,447,843 | 5/1984 | Massey | 361/76 |
| 4,479,160 | 10/1984 | Stacey | 307/127 X |

*Primary Examiner*—J. R. Scott
*Assistant Examiner*—Derick S. Jennings
*Attorney, Agent, or Firm*—Arnold E. Renner

[57] ABSTRACT

A negative sequence occurring in a polyphase power system control including a continuous wave frequency transducer causes a second harmonic to be generated which for a 60 Hz system comprises a 120 Hz signal. In a preferred embodiment of the invention, the continuous wave frequency transducer includes an active 120 Hz notch filter having one stage which provides a component of the 120 Hz second harmonic. This signal is coupled to a second harmonic detector implemented by a semiconductor diode connected to the output of an operational amplifier. The detector diode is coupled to one input of a comparator circuit whose other input is coupled to a selectable DC reference signal. The comparator operates to generate a fault indicating signal indicative of a negative sequence when the output from the second harmonic detector exceeds the reference. The fault indicating signal is thereafter converted to a digital type signal which can be utilized by external utilization circuitry such as a system control circuit or a diagnostic subsystem.

20 Claims, 3 Drawing Figures

NEGATIVE SEQUENCE DETECTOR FOR A CONTINUOUS WAVE FREQUENCY TRANSDUCER

CROSS REFERENCE TO RELATED APPLICATION

This application is related to U.S. patent Ser. No. 945,931 entitled, "On-Line Test And Diagnostic System For Power System Stabilizer", filed in the name of R. A. Lawson on Dec. 23, 1986, which is assigned to the assignee of this invention and is incorporated herein by reference.

BACKGROUND OF THE INVENTION

The present invention relates generally to apparatus for determining a negative sequence component of a three phase set of alternating current voltages and more particularly to apparatus for detecting phase unbalance or phase loss in a continuous wave frequency transducer.

Several power system control functions require the use of a measurement of frequency of a polyphase set of alternating voltages. Among these are power system stabilizer functions on generator exciters, high voltage direct current transmission systems, and static VAR compensators. These applications benefit from the use of a known continuous wave, phase locked loop type of frequency transducer, which provides wide bandwidth response and less sensitivity to noise. In some of these applications, it is desirable to disable the control function while severe unbalance of the AC system voltages exists or if a failure occurs in any phase of the voltage measuring equipment.

One type of known transducer for sensing frequency in a power system stabilizer (PSS) comprises a continuous wave frequency transducer (CWFT). The CWFT is well known and comprises a phase locked loop circuit which monitors the frequency of the input voltage, i.e. three phase (3φ) AC generator terminal voltage, and converts it to a direct current (DC) output voltage whose amplitude is proportional to frequency. The CWFT, in its broadest terms, comprises an implementation of a phase locked loop wherein the three phases of the generator terminal voltage are multiplied by three quadrature phase signal outputs from a voltage controlled oscillator (VCO). The three multiplier outputs are summed, fed to an integrator and a loop filter including a phase lead network, whose output comprises a signal corresponding to actual frequency. This actual frequency signal is compared to a DC reference frequency signal whereupon a frequency error signal is generated which is applied to the voltage controlled oscillator, which changes its output frequency until the error signal goes to zero. The predominate frequency is the fundamental power frequency, i.e. 60 Hz for a 60 Hz system.

Since the CWFT normally operates at zero volts, it is relatively difficult to detect a failure which results in a loss of transmission, since it will continue to operate for a negative sequence, i.e. when one or two of the input phase voltages are lost or a phase shift other than 120° occurs between the three phases.

The present invention utilizes an inherent characteristic of the CWFT to produce a signal proportional to the amount of negative sequence component in the set of alternating voltages. This signal, in turn, may be used for a variety of functions, among them being to switch out, or to adjust the parameters of, critical power system control functions.

SUMMARY OF THE INVENTION

It is an object of the invention, therefore, to provide an improvement in certain power system control functions.

It is another object of the invention to provide an improvement in continuous wave frequency transducers utilized in power system control functions.

It is a further object of the invention to provide an improvement in the control of a power system stabilizer.

Still another object of the invention is to detect a negative sequence on the input voltages to a continuous wave frequency transducer which manifests itself as a voltage unbalance between the three phases or a loss of one or more of the input phase voltages applied to a continuous wave frequency transducer.

The foregoing and other objects are achieved, in accordance with the present invention, by coupling a multi-stage second harmonic notch filter at the output of the phase error detector which monitors the difference between the input frequency to a continuous wave frequency transducer and the quadrature outputs of a voltage controlled oscillator whose frequency is varied in accordance with a frequency error signal comprising the difference between actual frequency and a reference frequency. A negative sequence causes a second harmonic signal to be generated. The second harmonic filter includes one stage which provides a second harmonic frequency component signal. This signal is coupled to a second harmonic detector whose output is fed to a comparator along with a second harmonic reference signal. The comparator outputs a fault indicating signal upon the occurrence of an output from the second harmonic detector which exceeds the reference. For a negative sequence in a three phase (3φ) power system, which includes a phase imbalance or a loss of a phase voltage, a relatively large second harmonic signal of 120 Hz is generated which appears at the output of the comparator for a 60 Hz power system frequency and comprises a 120 Hz fault indicating signal. This fault indicating signal is then converted to levels utilizable by one or more external utilization circuits such as system control circuitry and/or system diagnostic circuitry.

BRIEF DESCRIPTION OF THE DRAWING

While the present invention is particularly defined in the claims annexed to and forming a part of this specification, a better understanding can be had from the following description taken in conjunction with the accompanying drawing in which:

DETAILED DESCRIPTION

Figure 1:
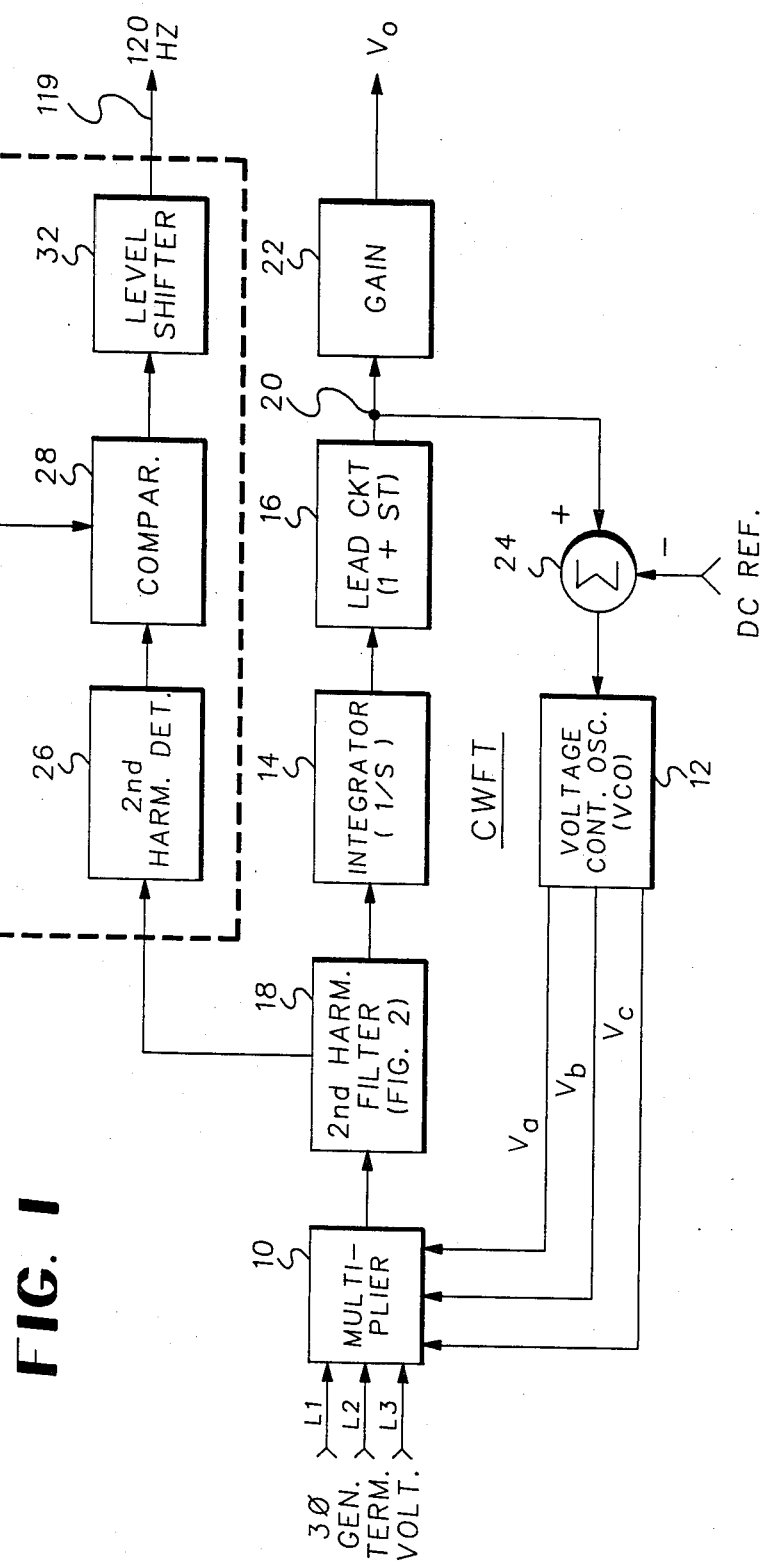
FIG. 1 is an electrical block diagram illustrative of the preferred embodiment of the invention coupled to a continuous wave frequency transducer utilized in a power system stabilizer.

Reference is now made to FIG. 1 which shows a continuous wave frequency transducer (CWFT) for power system stabilizer (PSS), not shown. The input to the CWFT is related to the voltages and frequency of a power system which may be comprised of a single three phase ($3\phi$) generator output or a bus comprised of many generator outputs.

As shown in FIG. 1, the input comprises three phases of a generator terminal output voltage which appear on lines $L_1$, $L_2$, and $L_3$. The line voltages are sinusoidal and have a given frequency, typically 60 Hz and are respectively phase displaced by 120 electrical degrees. The three line voltages appearing on $L_1$, $L_2$ and $L_3$ are applied to a multiplier circuit 10 which also receive three sinusoidal output signals appearing on lines $V_a$, $V_b$ and $V_c$ from a voltage controlled oscillator (VCO) 12 which generates three signals mutually spaced 120 electrical degrees apart and which are, respectively, in quadrature with three input line voltages appearing on $L_1$, $L_2$ and $L_3$. The multiplier 10 operates to multiply the signal pairs $L_1$ and $V_a$, $L_2$ and $V_b$, and $L_3$ and $V_c$ and sum the three resulting outputs. The multiplier 10 in effect operates as a phase error detector which compares the three inputs to the CWFT with the three VCO outputs which are in quadrature with the inputs.

The summed output of the three phase multiplier 10 heretofore was applied to an integrator 14 having a transfer function 1/S, wherein S comprises the complex variable of a Laplace transform. The output of integrator 14 is applied to a lead network 16 having a transform of $1+ST$ where T is the time constant of the lead network.

In the present invention, a second harmonic notch filter circuit 18 is coupled between the multiplier 10 and the integrator 14 and will be discussed later. The output of the lead network 16 appears at a circuit node 20 and comprises a DC signal of varying amplitude proportional to the difference between the instantaneous frequency of the input signals appearing on lines $L_1$, $L_2$ and $L_3$ and instantaneous frequency of the three outputs from the voltage controlled oscillator 12 appearing on lines $V_a$, $V_b$ and $V_c$. The signal appearing at circuit node 20 is applied to an output amplifier 22 having a predetermined gain and to one input of a summing junction 24, the output of which forms the input to the voltage controlled oscillator 12. The other input to the summing junction 24 comprises a positive DC reference signal which may be derived, for example, from the wiper arm of a suitable potentiometer, not shown, coupled between a source of positive potential and ground in a well known manner.

Thus it is seen that the output of the summing junction 24, that is, the input to the voltage controlled oscillator 12 is the sum of the frequency difference signal at node 20 and the DC reference signal. The DC reference signal is set to a value which in the absence of any signal at node 20 will cause the voltage controlled oscillator 12 to run at a frequency equal to the anticipated frequency of the input signals, e.g. 60 Hz on lines $L_1$, $L_2$ and $L_3$. As is well known the addition of any voltage signal at node 20 will cause the VCO 12 to run at a frequency which is either higher or lower than the anticipated input frequency dependent upon the relative polarity of the input signal. The magnitude of the difference in oscillator frequency from the anticipated frequency is of course a function of the magnitude of the signal appearing at node 20.

So long as a frequency difference exists between the two sets of inputs to the multiplier 10 (inherently producing a phase differential of other than 90°) the signal output of the multiplier 10 will have a value other than zero, which when integrated, causes the value of the signal at node 20 to change and thus vary the frequency output of the voltage controlled oscillator 12. This change in the VCO output will continue until such time as the frequencies on the lines $V_a$, $V_b$ and $V_c$ are the same as that of the input voltages on lines $L_1$, $L_2$ and $L_3$. Thus there has been provided a simple and relatively inexpensive phase locked loop for providing an output frequency which is proportional to the frequency of the input signal, i.e., the three phase generator terminal voltage on lines $L_1$, $L_2$ and $L_3$.

This now leads to a consideration of the subject invention which is directed to a negative sequence detector for the continuous wave frequency transducer. A negative sequence on the input voltages on lines $L_1$, $L_2$ and $L_3$ manifests itself as a voltage unbalance between the phases of the $3\phi$ input or a phase shift other than 120° between the three phases. This unbalance can be as extreme as a loss of a phase wherein one or more phases are shorted to ground or to each other. When this occurs, a relatively large second harmonic (120 Hz for a 60 Hz system) is generated.

Figure 2:
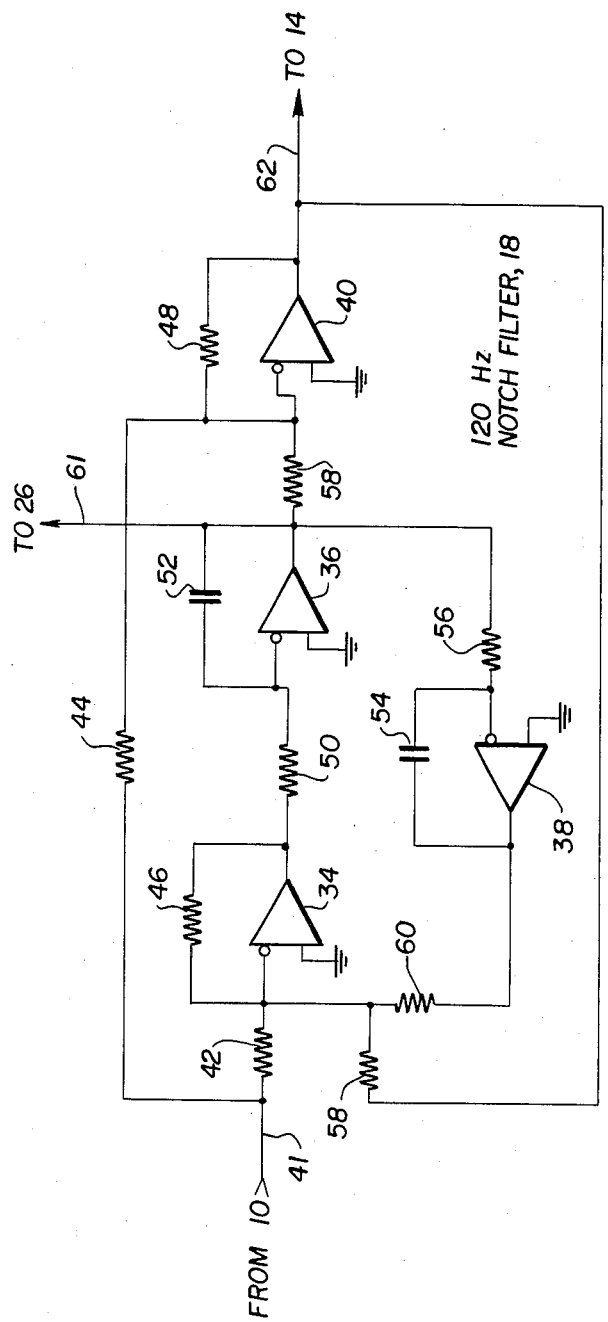
FIG. 2 is an electrical schematic diagram illustrative of the details of the second harmonic filter shown in FIG. 1.

In order to minimize the output ripple caused by a phase unbalance in the input voltage as well as a phase loss of the input voltage, there is provided second harmonic filter 18. This filter can be implemented in a well known manner such as by means of a notch filter whose notch is located at a center frequency $\omega_0$ of the second harmonic. A preferred embodiment comprises an active "biquad" filter, the details of which are shown in FIG. 2, having a transfer function of:

$$G = \frac{S^2 + \alpha N \times \omega_0 \times S + \omega_0^2}{S_2 + \alpha D \times \omega_0 \times S + \omega_0^2} \quad (1)$$

where, as before, S is the Laplace operator and $\alpha N$ and $\alpha D$ are coefficients which determine the sharpness of the skirts of the frequency response, and $\omega_0$ is the center frequency of the notch.

Figure 3:
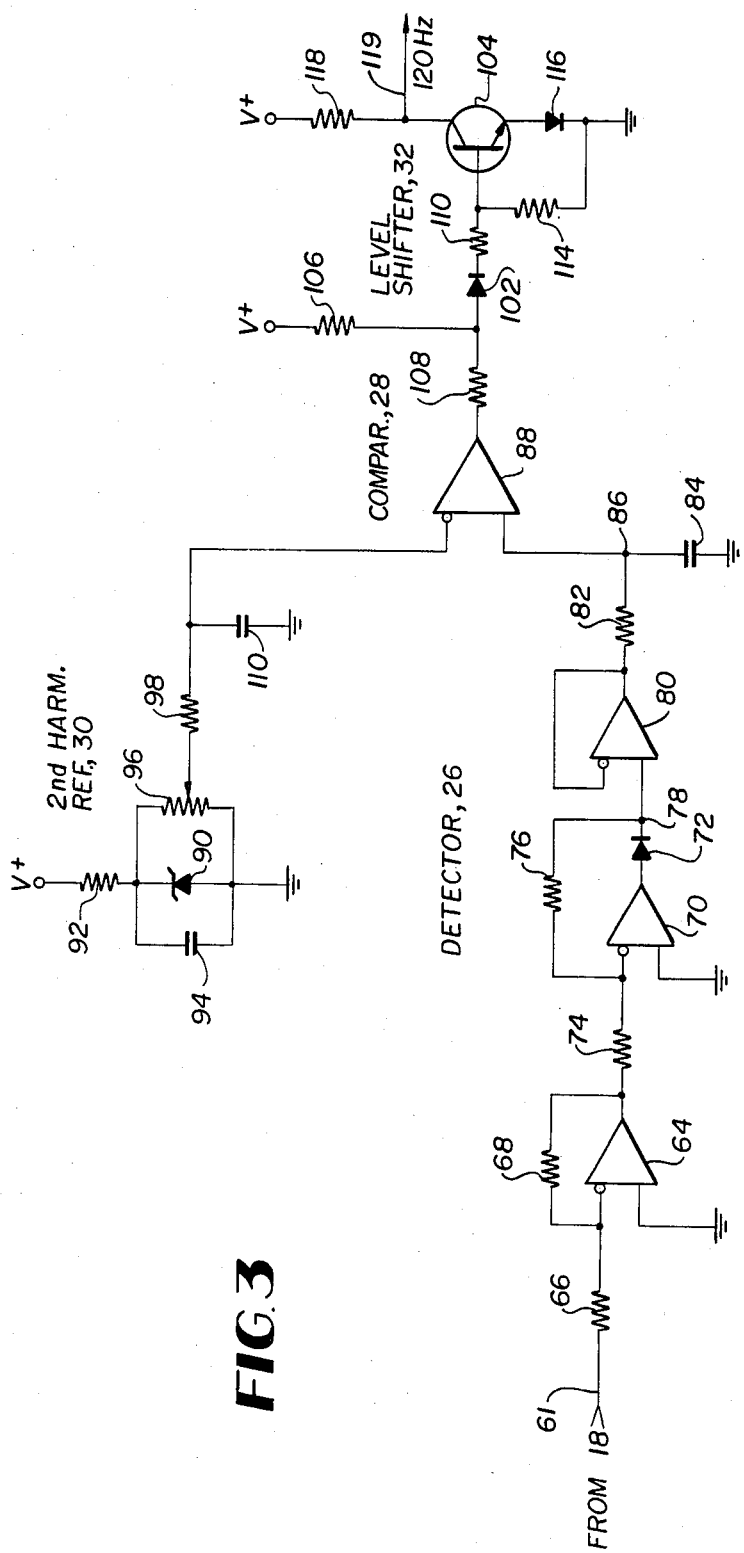
FIG. 3 is an electrical schematic diagram illustrative of the details of the negative sequence detector as shown in FIG. 1.

To detect the presence of the second harmonic, i.e. 120 Hz, there is additionally provided a negative sequence detector, the details of which is shown in FIG. 3. The negative sequence detector includes a second harmonic detector 26 which is coupled to the notch filter 18 because, as will be shown, a 120 Hz component exists therein for any negative sequence which might occur. However, it should be noted that the 120 Hz second harmonic could be picked off of the output of the multiplier 10, if desired. The output of the second harmonic detector 26 is coupled to a comparator circuit 28 which receives a second input comprising a DC reference signal from a second harmonic reference circuit 30. When a preset reference value is exceeded, an output signal is coupled to an output circuit 32 comprising, for example, a level shifter which provides a digital 120 Hz fault signal output adaptable for TTL levels.

Referring now to FIG. 2, there is disclosed a schematic diagram of the second harmonic notch filter 18, which as noted above, comprises an active "biquad" notch filter and which implements the transfer function of equation (1). This type of circuit is well known in the art of signal filter design and is comprised of four operational amplifiers 34, 36, 38 and 40 which have their non-inverting inputs coupled to ground. The output from the multiplier 10 on circuit lead 41 is fed simultaneously to the inverting inputs of the first and fourth operational amplifiers 34 and 40 via resistors 42 and 44, respectively. Operational amplifiers 34 and 40 include feedback resistors 46 and 48 from their respective outputs to their inverting inputs. The output of the first operational amplifier 34 couples to the inverting input of the second operational amplifier 36 by means of a coupling resistor 50. The second operational amplifier 36 as well as the third operational amplifier 38 have a capacitive feedback by way of fixed capacitors 52 and 54 from their respective outputs back to their inverting inputs. Operational amplifiers 36 and 38 each effect a quadrature phase shift of their respective input signals. Further as shown in FIG. 2, the output of operational amplifier 36 is commonly coupled to the inverting input of the third operational amplifier 38 via resistor 56 and to the fourth operational amplifier 40 via resistor 58. The outputs of operational amplifiers 38 and 40 are both coupled back to the inverting input of the first operational amplifier 34 by means of resistors 58 and 60, respectively.

In such an arrangement of circuit elements, the output of the second stage of the filter, i.e. operational amplifier 36, contains only a second harmonic or a 120 Hz frequency component signal. This signal is coupled by circuit lead 61 to the second harmonic detector 26 (FIG. 1). The details of the second harmonic detector are shown in FIG. 3. The signal appearing at the output of operational amplifier 40 is coupled by way of circuit lead 62 to the integrator circuit 14 of FIG. 1.

Referring now to FIG. 3 which discloses the details of the negative sequence detector, the second harmonic signal (120 Hz) from the second stage, i.e. operational amplifier 36 (FIG. 2) of the notch filter 18, is coupled via circuit lead 61 and resistor 66 to the inverting input of an operational amplifier 64. The non-inverting input of operational amplifier 64 is grounded. Amplifier 64 has a resistive feedback comprising the resistor 68 from the output back to its inverting input. Operational amplifier 64 acts to increase the 120 Hz input signal by a factor (gain) of ten (G=10) which increased signal is then coupled to the inverting input of a unity gain operational amplifier 70 which additionally has a half-wave rectifier diode 72 coupled to its output. The non-inverting input of operational amplifier 70 is connected to ground. Coupling from operational amplifier 64 to the operational amplifier 70 is by way of fixed resistor 74. A feedback resistor 76 couples from the cathode side of the diode 72 back to the inverting input of operational amplifier 70.

The diode 72 acts as a detector of the second harmonic by providing a half-wave rectified signal at circuit node 78. This signal is fed to the non-inverting input of a unity gain buffer operational amplifier 80 which also includes a direct feedback from its output to the inverting input.

The output of the operational amplifier 80 is next fed to a high frequency filter consisting of a fixed resistor 82 and capacitor 84. The high frequency filter output appears at the circuit node 86 and is fed to the non-inverting input of an operational amplifier 88 which implements the comparator circuit 28 shown in FIG. 1. The other input to the comparator 28 comprises a DC reference voltage which is coupled to the inverting input of operational amplifier comparator 88 and which is generated by means of a zener diode 90 coupled across a fixed power supply potential V+ via a resistor 92. A filter capacitor 94 additionally shunts the zener diode 90. The zener diode 90 is selected so as to provide a fixed potential (10 volts) thereacross. A potentiometer 96 is furthermore coupled across the zener diode 90. The slider of the potentiometer 96 provides a DC reference potential of between 0 and 10 volts which is coupled to the inverting input of operational amplifier 88 via a high frequency filter consisting of resistor 98 and capacitor 100.

The potentiometer 96 thus provides a means of providing a selectively variable threshold voltage for the comparator 28 such that when the detected 120 Hz output at circuit node 86 exceeds the selected reference potential, an output appears at the output of the comparator operational amplifier 88. This output is then coupled to the level shifting circuit 32 including a second half-wave rectifying diode 104 and a transistor 102. A bias potential for the diode 104 is applied to its anode electrode by means of resistor 106 coupled to a source of positive supply potential V+ and the output resistor 108 from the comparator operational amplifier 88. The cathode electrode of the diode 104 is coupled to the base of a transistor 102 by means of the resistors 110 and 114. The emitter of transistor 102 is coupled to ground via a diode 116 while its collector electrode is coupled to a source of positive supply potential V+ via resistor 118.

In operation, when the second harmonic reference value is exceeded, the output of the comparator operational amplifier 88 (normally low) is supplied via diode 104 to transistor 102 which turns on, i.e. becomes conductive, causing a "low" going digital type of output signal to appear at the transistor's collector electrode and accordingly on circuit lead 119, thereby providing an indication that an unbalance between phases or loss of the phase of the input three phase voltages coupled to the continuous wave frequency transducer exists. Such an indication is particularly important for certain control functions, as well as for self diagnostics, since the CWFT will continue to operate when a negative sequence develops and if the negative sequence is excessive, the turbine generator control will not properly respond to the output of the CWFT.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. Apparatus for detecting a negative sequence of input phase voltages to a continuous wave frequency transducer comprising:
    (a) means for providing a first signal in response to the occurrence of a negative sequence of said phase voltages, said first signal comprising a second harmonic frequency signal of said phase voltages;
    (b) means for detecting said first signal and providing a detection signal having an amplitude proportional to the magnitude of said first signal;
    (c) means for generating a reference signal of predetermined selected amplitude; and
    (d) signal comparator means coupled to and being responsive to said detection signal and said reference signal for providing an output signal when the amplitude of said detection signal exceeds the amplitude of said reference signal, said output signal providing an indication of said negative sequence.

2. The apparatus in accordance with claim 1 wherein said means for providing said first signal comprises circuit means included in said continuous wave frequency transducer.

3. The apparatus in accordance with claim 2 wherein said means for providing said first signal comprises one section of a multi-section filter.

4. The apparatus in accordance with claim 3 wherein said filter comprises an active filter having one section which provides said second harmonic frequency signal.

5. The apparatus in accordance with claim 4 wherein said filter comprises a notch filter having a frequency notch at the second harmonic frequency signal.

6. The apparatus in accordance with claim 1 wherein said means for detecting comprises detector diode means coupled to said means for providing said first signal.

7. The apparatus in accordance with claim 6 wherein said diode means comprises a half-wave diode rectifier.

8. The apparatus in accordance with claim 6 and additionally including first signal amplifier means coupled between said means providing said first signal and said diode means.

9. The apparatus in accordance with claim 8 and additionally including second amplifier means coupled to the output of said first signal amplifier means and wherein said diode means is coupled to the output of said second amplifier means.

10. The apparatus in accordance with claim 9 wherein said second amplifier means comprises a unity gain amplifier.

11. The apparatus in accordance with claim 10 and additionally including third amplifier means coupled between said diode means and said signal comparator means, said third amplifier means operating as a signal buffer.

12. The apparatus in accordance with claim 11 wherein said first, second and third amplifier means comprise operational amplifier circuit means.

13. The apparatus in accordance with claim 1 and additionally including first and second high frequency filter circuits respectively coupled between said means for detecting said first signal, said means for generating a reference signal and said signal comparator means.

14. The apparatus in accordance with claim 1 wherein said comparator means comprises a comparator amplifier having first and second inputs and wherein said means for detecting said first signal is coupled to said first input and said means for generating a reference signal is coupled to said second input, said comparator amplifier being further operable to generate said output signal when the amplitude of said detection signal exceeds the amplitude of said reference signal.

15. The apparatus in accordance with claim 1 and additionally including means for converting the level of said output signal for use by external utilization means.

16. The apparatus in accordance with claim 15 wherein said converting means comprises means for converting said output signal to a digital type output signal.

17. The apparatus in accordance with claim 16, wherein said converting means comprises electronic switch means which is driven from a first operating state to a second operating state in response to said output signal.

18. The apparatus in accordance with claim 17 wherein said electronic switch means comprises a semiconductor switch which is driven from a nonconductive state to a conducting state in response to said output signal.

19. The apparatus in accordance with claim 17 and additionally including signal rectifier means coupled between said signal comparator means and said electronic switch means.

20. The apparatus in accordance with claim 19 wherein said rectifier means comprises half-wave rectifier means.

* * * * *